US009756752B2

(12) United States Patent
Ma et al.

(10) Patent No.: US 9,756,752 B2
(45) Date of Patent: Sep. 5, 2017

(54) CIRCUIT BOARD POSITIONING DEVICE

(71) Applicant: Boe Technology Group Co., Ltd., Beijing (CN)

(72) Inventors: Yongda Ma, Beijing (CN); Jianbo Xian, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 20 days.

(21) Appl. No.: 14/784,623

(22) PCT Filed: Mar. 13, 2015

(86) PCT No.: PCT/CN2015/074210
§ 371 (c)(1),
(2) Date: Oct. 15, 2015

(87) PCT Pub. No.: WO2016/082372
PCT Pub. Date: Jun. 2, 2016

(65) Prior Publication Data
US 2016/0330856 A1 Nov. 10, 2016

(30) Foreign Application Priority Data
Nov. 24, 2014 (CN) ...................... 2014 2 0713600 U

(51) Int. Cl.
*H05K 9/00* (2006.01)
*H05K 7/14* (2006.01)
*H05K 3/00* (2006.01)
(52) U.S. Cl.
CPC .............. *H05K 7/1405* (2013.01); *H05K 3/00* (2013.01); *H05K 7/142* (2013.01); *H05K 7/1417* (2013.01)

(58) Field of Classification Search
CPC ...... H05K 7/14; H05K 7/1401; H05K 7/1402; H05K 7/1404; H05K 7/1405; H05K 7/1417; H05K 7/1418
(Continued)

(56) References Cited

U.S. PATENT DOCUMENTS 5,535,969 A * 7/1996 Duffy, Jr. ................ F16L 3/227
24/487
5,642,263 A * 6/1997 Lauruhn ................. G06F 1/184
211/41.17
(Continued)

FOREIGN PATENT DOCUMENTS

| CN | 2000-196263 | 7/2000 |
| CN | 201115150 | 9/2008 |

(Continued)

OTHER PUBLICATIONS

International Search Report and Written Opinion from PCT/CN2015/074210 dated Aug. 27, 2015.

*Primary Examiner* — Steven Marsh
(74) *Attorney, Agent, or Firm* — Calfee, Halter & Griswold LLP

(57) ABSTRACT

The present application discloses a circuit board positioning device, comprising: a beam, a first side of the beam forming a circuit board supporting surface, and the first side being provided with a first fixture block and a second fixture block, a first positioning slot being formed on the first fixture block, a second positioning slot being formed on the second fixture block, the first positioning slot and the second positioning slot being used for limiting positions of two opposite side edges in the circuit board; a snap-fit, one end of the snap-fit being rotatablely mounted on the beam around one end of the beam; a lock mechanism being provided between the snap-fit and the beam for locking the snap-fit and the beam when the snap-fit is in a closed position, and a side of the (Continued)

snap-fit facing towards the beam being provided with at least one elastic pressing sheet protruding towards the beam when being in the closed position. The circuit board positioning device can protect the circuit board from being damaged when shock occurs.

20 Claims, 2 Drawing Sheets

(58) Field of Classification Search
USPC .......................................... 248/71, 74.1, 74.2
See application file for complete search history.

(56) References Cited

U.S. PATENT DOCUMENTS

| | | | | |
|---|---|---|---|---|
| 6,164,603 | A | * 12/2000 | Kawai | F16L 3/23 24/297 |
| 7,304,861 | B2 | * 12/2007 | Takahashi | H02G 3/32 248/74.3 |
| 2003/0213876 | A1 | * 11/2003 | Takeuchi | F16B 21/02 248/71 |
| 2012/0145837 | A1 | * 6/2012 | Li | H02G 3/32 248/74.2 |

FOREIGN PATENT DOCUMENTS

| | | |
|---|---|---|
| CN | 101813839 | 8/2010 |
| CN | 202308609 | 7/2012 |
| CN | 204191025 | 3/2015 |
| JP | 2000-196263 | 7/2000 |
| TW | 200908856 | 2/2009 |

* cited by examiner

CIRCUIT BOARD POSITIONING DEVICE

RELATED APPLICATIONS

The present application is the U.S. national phase entry of PCT/CN2015/074210, with an international filing date of Mar. 13, 2015, which claims the benefit of Chinese Patent Application No. 201420713600.8, filed Nov. 24, 2014, the entire disclosures of which are incorporated herein by reference.

FIELD OF THE INVENTION

The present application relates to the field of circuit board technology, particularly to a circuit board positioning device.

BACKGROUND OF THE INVENTION

At present, with the development of the microelectronic technology, the printed circuit board has been widely used in this technical field. Presently, for circuit board positioning, a plurality of screws are used for positioning in the industry, it is hard contact between the circuit board and the carrier backboard, which is not convenient for disassembly, moreover, the circuit board may be easily damaged when shock occurs.

SUMMARY OF THE INVENTION

The present application provides a circuit board positioning device which can protect the circuit board from being damaged when shock occurs, and is convenient for disassembly of the circuit board.

In order to achieve the above object, the present application provides the following technical solutions:

A circuit board positioning device, comprising:

a beam, a first side of the beam forming a circuit board supporting surface, and the first side being provided with a first fixture block and a second fixture block, a first positioning slot being formed on a side of the first fixture block facing towards the second fixture block, a second positioning slot being formed on a side of the second fixture block facing towards the first fixture block, the first positioning slot and the second positioning slot being used for limiting positions of two opposite side edges in the circuit board; the beam being provided with a fixed mechanism for being fixedly connected with a carrier backboard;

a snap-fit, one end of the snap-fit being rotatablely mounted on the beam around one end of the beam; a lock mechanism being provided between the snap-fit and the beam for locking the snap-fit and the beam when the snap-fit is in a closed position, and a side of the snap-fit facing towards the beam being provided with at least one elastic pressing sheet protruding towards the beam when being in the closed position.

When the above circuit board positioning device is used to position the circuit board, firstly the snap-fit is made to be in an open position, the two opposite side edges of the circuit board to be positioned are inserted into the first positioning slot on the first fixture block and the second positioning slot on the second fixture block of the beam respectively, then, the snap-fit is made to rotate around one end of the beam to enable the snap-fit to reach the closed position, the snap-fit and the beam are locked through a lock mechanism. Here, the position of the circuit board is limited through the first positioning slot on the first fixture block and the second positioning slot on the second fixture block along a direction parallel to the extending direction of the circuit board, meanwhile, the elastic pressing sheet on the snap-fit presses the circuit board against the circuit board supporting surface of the beam, to limit the position of the circuit board along a direction perpendicular to the circuit board. The beam can be mounted on the carrier backboard through a fixed mechanism arranged thereon, so as to realize mounting between the circuit board and the carrier backboard finally. The elastic pressing sheet of the above circuit board positioning device has certain buffer function, hence, when shock occurs, the circuit board positioning device can isolate shock from the carrier backboard partly.

Therefore, the above circuit board positioning device can protect the circuit board from being damaged when shock occurs.

Moreover, screws do not have to be used when the circuit board and the carrier backboard are mounted using the above circuit board positioning device, which is convenient for mounting of the circuit board.

Optionally, the first fixture block and the second fixture block have an integrated structure with the beam.

Optionally, the first fixture block and the second fixture block are made of an elastic material.

Optionally, the fixed mechanism is an elastic clasp.

Optionally, the elastic clasp is located at the middle of the beam or located at two ends of the beam.

Optionally, one end of the snap-fit being rotatablely mounted on the beam around one end of the beam specifically comprises: one end of the snap-fit being mounted on the first fixture block.

Optionally, the snap-fit and the first fixture block have an integrated structure.

Optionally, the lock mechanism comprises: an elastic slot arranged on the snap-fit and an elastic clasp arranged on the beam; or an elastic clasp arranged on the snap-fit and an elastic slot arranged on the beam.

Optionally, the number of the elastic pressing sheets is two.

Optionally, a rotation axis for the snap-fit rotating around one end of the beam is parallel to the supporting surface and perpendicular to an arrangement direction of the first fixture block and the second fixture block.

DETAILED DESCRIPTION OF THE INVENTION

Next, the technical solutions in the embodiments of the present application will be described clearly and completely in combination with the drawings of the present application. Apparently, the embodiments described are only part of rather than all of the embodiments of the present application. Based on the embodiments in the present application, all other embodiments obtained by the ordinary skilled person in the art without paying any creative work belong to the protection scope of the present application.

Figure 1:
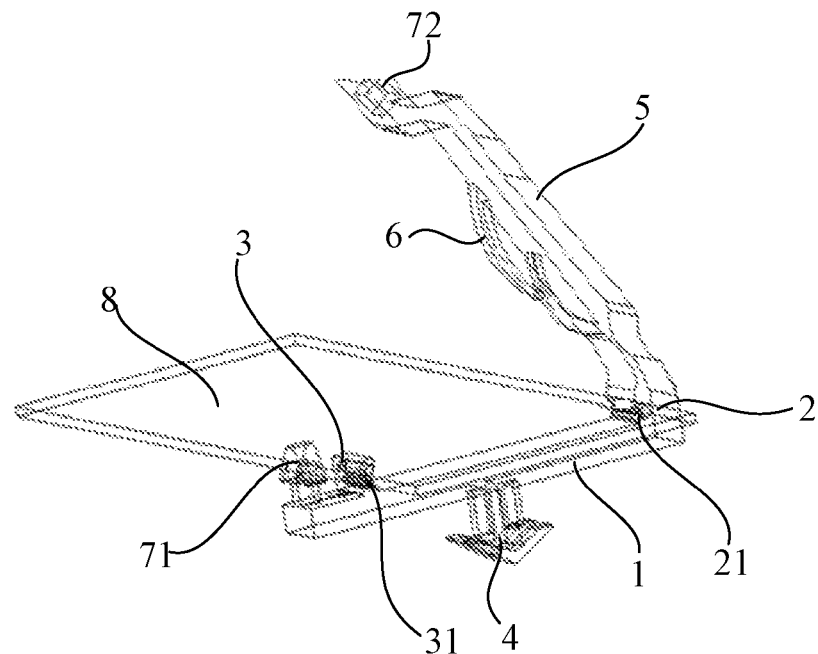
FIG. 1 is a structural schematic view of cooperative mounting of a first positioning slot and a second positioning slot in a circuit board positioning device provided by an embodiment of the present application with a circuit board.
Figure 2:
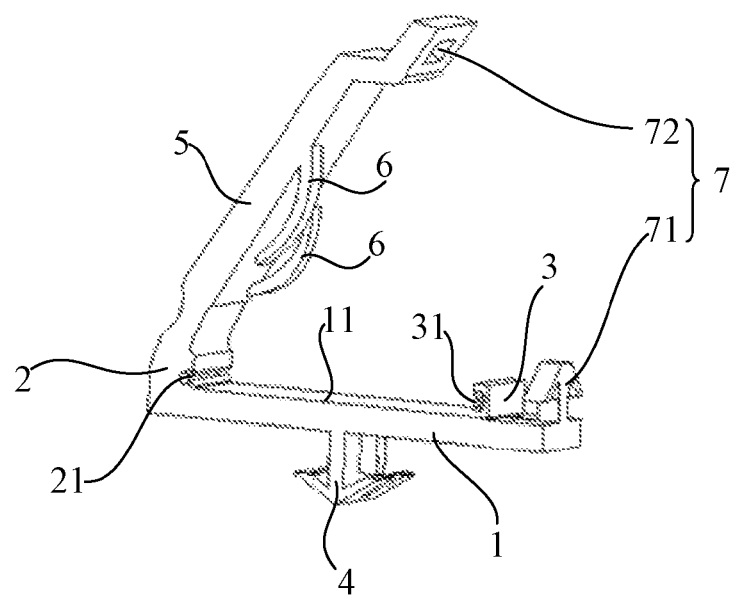
FIG. 2 is a structural schematic view of a circuit board positioning device provided by an embodiment of the present application.
Figure 3:
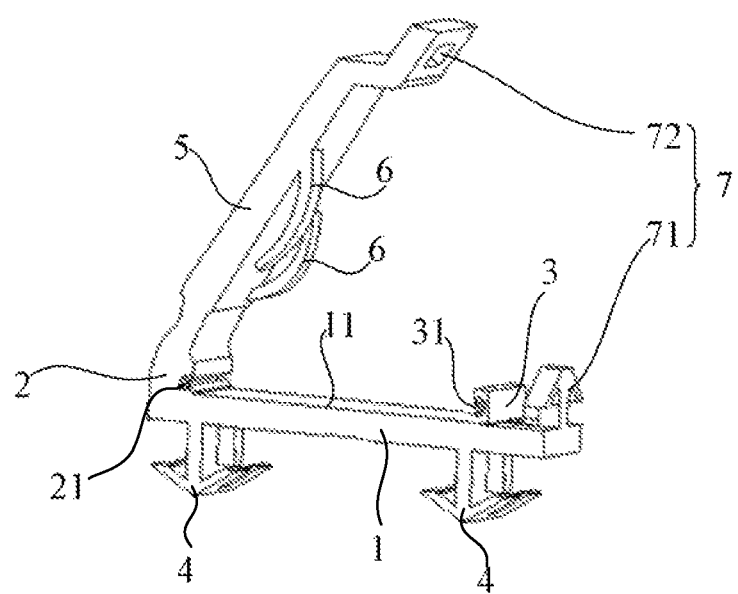
FIG. 3 is a structural schematic view of a circuit board positioning device provided by another embodiment of the present application.

Referring to FIG. 1, FIG. 2, and FIG. 3, FIG. 1 is a structural schematic view of cooperative mounting of a first positioning slot and a second positioning slot in a circuit board positioning device provided by an embodiment of the present application with a circuit board; FIG. 2 is a structural schematic view of a circuit board positioning device provided by an embodiment of the present application; FIG. 3 is a structural schematic view of a circuit board positioning device provided by another embodiment of the present application.

As shown in FIG. 1, FIG. 2, and FIG. 3, a circuit board positioning device provided by the embodiment of the present application comprises:

a beam 1, a first side of the beam 1 forming a circuit board supporting surface 11, and the first side being provided with a first fixture block 2 and a second fixture block 3. A first positioning slot 21 is formed on a side of the first fixture block 2 facing towards the second fixture block 3, a second positioning slot 31 is formed on a side of the second fixture block 3 facing towards the first fixture block 2. The first positioning slot 21 and the second positioning slot 31 are used for limiting positions of two opposite side edges in the circuit board 8. The beam 1 is provided with a fixed mechanism 4 for being fixedly connected with a carrier backboard.

A snap-fit 5, one end of the snap-fit 5 is rotatably mounted on the beam 1 around one end of the beam. A lock mechanism 7 is provided between the snap-fit 5 and the beam 1 for locking the snap-fit 5 and the beam 1 when the snap-fit 5 is in a closed position, and a side of the snap-fit 5 facing towards the beam 1 is provided with at least one elastic pressing sheet 6 protruding towards the beam 1 when being in the closed position.

In a preferred embodiment, the circuit board positioning device may have more than two sets of beam 1 and snap-fit 5, for example, arranged on the two ends of the circuit board.

When the above circuit board positioning device is used to position the circuit board 8, firstly the snap-fit 5 is made to be in an open position, the two opposite side edges of the circuit board 8 to be positioned are inserted into the first positioning slot 21 on the first fixture block 2 and the second positioning slot 31 on the second fixture block 3 of the beam 1 respectively. Then, the snap-fit 5 is made to rotate around one end of the beam to enable the snap-fit 5 to reach the closed position, the snap-fit 5 and the beam 1 are locked through a lock mechanism 7. Here, the position of the circuit board 8 is limited through the first positioning slot 21 on the first fixture block 2 and the second positioning slot 31 on the second fixture block 3 along a direction parallel to the extending direction of the circuit board 8, meanwhile, the elastic pressing sheet 6 on the snap-fit 5 presses the circuit board 8 against the circuit board supporting surface 11 of the beam 1, to limit the position of the circuit board 8 along a direction perpendicular to the circuit board 8. The beam 1 can be mounted on the carrier backboard through a fixed mechanism 4 arranged thereon, so as to realize mounting between the circuit board 8 and the carrier backboard finally. The elastic pressing sheet 6 of the above circuit board positioning device has certain buffer function, hence, when shock occurs, the circuit board positioning device can isolate shock from the carrier backboard partly.

Therefore, the above circuit board positioning device can protect the circuit board 8 from being damaged when shock occurs.

Moreover, screws do not have to be used when the circuit board 8 and the carrier backboard are mounted using the above circuit board positioning device, which is convenient for mounting of the circuit board 8.

Preferably, the extending direction of the first positioning slot 21 and the extending direction of the second positioning slot 31 are parallel, and the extending direction of the first positioning slot 21 is parallel to the circuit board supporting surface 11, and perpendicular to the arrangement direction of the first fixture block 2 and the second fixture block 3.

Indeed, the extending direction of the first positioning slot 21 and the extending direction of the second positioning slot 31 should be determined based on the shape of the circuit board specifically.

As shown in FIG. 1, FIG. 2, and FIG. 3, in a specific embodiment, the first fixture block 2 and the second fixture block 3 have an integrated structure with the beam 1, i.e., forming an integral structure.

As shown in FIG. 1, FIG. 2, and FIG. 3, on the basis of the above embodiment, in a preferred embodiment, the first fixture block 2 and the second fixture block 3 are made of an elastic material. Since the first fixture block 2 and the second fixture block 3 are made of an elastic material, the clutch performed by the first positioning slot 21 and the second positioning slot 31 to the two side edges of the circuit board 8 is elastic clutch. The elastic clutch can make the positioning of the circuit board 8 more stable and can buffer certain external shock, which can protect the circuit board 8 from being damaged.

As shown in FIG. 1, FIG. 2, and FIG. 3, on the basis of the above embodiments, in a specific embodiment, the fixed mechanism 4 is an elastic clasp. In a preferred embodiment, the elastic clasp is located at the middle of the beam 1, and located on a side of the beam 1 deviating from the circuit board supporting surface 11. In another preferred embodiment, the elastic clasp is located at two ends of the beam 1, and located on a side of the beam 1 deviating from the circuit board supporting surface 11. A slot is arranged at a corresponding position on the carrier backboard, the circuit board positioning device can be fixed on the carrier backboard through fastening of the elastic clasp and the slot, thereby enabling the mounting process convenient. Moreover, the stress on the elastic clasp located at the middle of the beam 1 is balanced thereby enabling the circuit board positioning device to be more stable. Certainly, the elastic clasp may also be located on the sides of the two ends of the beam 1. In another preferred embodiment, a slot can be arranged on the beam 1, an elastic clasp is arranged at a corresponding position of the carrier backboard, so as to fix the circuit board positioning device on the carrier backboard through fastening of the elastic clasp and the slot. There may be two pairs or more than two pairs of elastic clasps and slots.

As shown in FIG. 1, FIG. 2, and FIG. 3, on the basis of the above embodiments, in a specific embodiment, one end of the snap-fit 5 is mounted on the first fixture block 2, thereby enabling one end of the snap-fit 5 to be mounted on the beam 1. In a preferred embodiment, the snap-fit 5 and the first fixture block 2 have an integrated structure. The snap-fit 5, the first fixture block 2, the second fixture block 3 and the beam 1 are in an integrated structure so that the circuit board positioning mechanism is more stable and reliable.

On the basis of the above embodiments, in a specific embodiment, the lock mechanism 7 may comprise: as shown in FIG. 1, FIG. 2, and FIG. 3, an elastic slot 72 arranged on the snap-fit 5 and an elastic clasp 71 arranged on the beam 1; or an elastic clasp arranged on the snap-fit 5 and an elastic slot arranged on the beam 1 (not shown).

Indeed, the lock mechanism 7 may further comprise other structures, such as a hasp, a Velcro etc., that can lock the snap-fit 5 and the beam 1 together.

As shown in FIG. 1, FIG. 2, and FIG. 3, on the basis of the above embodiments, in a preferred embodiment, the number of the elastic pressing sheets 6 is two.

As shown in FIG. 1, FIG. 2, and FIG. 3, on the basis of the above embodiments, in a preferred embodiment, a rotation axis for one end of the snap-fit rotating around one end of the beam is parallel to the supporting surface of the beam 1 and perpendicular to an arrangement direction of the first fixture block 2 and the second fixture block 3.

Apparently, the skilled person in the art can make various modifications and variations to the embodiments of the present application without departing from the spirit and scope of the present application. Thus, provided that these modifications and variations of the present application belong to the scopes of the claims of the present application and the equivalent technologies thereof, the present application will also intend to cover these modifications and variations.

The invention claimed is:

1. A circuit board positioning device, comprising:
    a beam, a first side of the beam forming a circuit board supporting surface, and the first side being provided with a first fixture block and a second fixture block, a first positioning slot being formed on a side of the first fixture block facing towards the second fixture block, a second positioning slot being formed on a side of the second fixture block facing towards the first fixture block, the first positioning slot and the second positioning slot being used for limiting positions of two opposite side edges in the circuit board;
    a fixed mechanism for fixedly connecting the beam with a carrier backboard;
    a snap-fit, one end of the snap-fit being rotatably mounted on the beam around one end of the beam;
    a lock mechanism being provided between the snap-fit and the beam for locking the snap-fit and the beam when the snap-fit is in a closed position; and
    at least one elastic pressing sheet disposed on a side of the snap-fit facing and protruding towards the beam when the snap-fit is in a closed position.

2. The circuit board positioning device according to claim 1, wherein the first fixture block and the second fixture block have an integrated structure with the beam.

3. The circuit board positioning device according to claim 1, wherein the first fixture block and the second fixture block are made of an elastic material.

4. The circuit board positioning device according to claim 1, wherein the fixed mechanism is an elastic clasp.

5. The circuit board positioning device according to claim 4, wherein the location of the elastic clasp on the beam is selected from the group consisting of the middle of the beam and both ends of the beam.

6. The circuit board positioning device according to claim 1, wherein one end of the snap-fit is rotatably mounted on the beam around one end of the beam and one end of the snap-fit is mounted on the first fixture block.

7. The circuit board positioning device according to claim 6, wherein the snap-fit and the first fixture block have an integrated structure.

8. The circuit board positioning device according to claim 1, wherein the lock mechanism comprises:
    an elastic slot arranged on one of the snap-fit and the beam; and
    an elastic clasp arranged on the other of the snap-fit and the beam.

9. The circuit board positioning device according to claim 1, wherein the number of the elastic pressing sheets is two.

10. The circuit board positioning device according to claim 2, wherein the number of the elastic pressing sheets is two.

11. The circuit board positioning device according to claim 3, wherein the number of the elastic pressing sheets is two.

12. The circuit board positioning device according to claim 4, wherein the number of the elastic pressing sheets is two.

13. The circuit board positioning device according to claim 6, wherein the number of the elastic pressing sheets is two.

14. The circuit board positioning device according to claim 8, wherein the number of the elastic pressing sheets is two.

15. The circuit board positioning device according to claim 1, wherein a rotation axis for the snap-fit rotating around one end of the beam is parallel to the supporting surface and perpendicular to an arrangement direction of the first fixture block and the second fixture block.

16. The circuit board positioning device according to claim 2, wherein a rotation axis for the snap-fit rotating around one end of the beam is parallel to the supporting surface and perpendicular to an arrangement direction of the first fixture block and the second fixture block.

17. The circuit board positioning device according to claim 3, wherein a rotation axis for the snap-fit rotating around one end of the beam is parallel to the supporting surface and perpendicular to an arrangement direction of the first fixture block and the second fixture block.

18. The circuit board positioning device according to claim 4, wherein a rotation axis for the snap-fit rotating around one end of the beam is parallel to the supporting surface and perpendicular to an arrangement direction of the first fixture block and the second fixture block.

19. The circuit board positioning device according to claim 6, wherein a rotation axis for the snap-fit rotating around one end of the beam is parallel to the supporting surface and perpendicular to an arrangement direction of the first fixture block and the second fixture block.

20. The circuit board positioning device according to claim 8, wherein a rotation axis for the snap-fit rotating around one end of the beam is parallel to the supporting surface and perpendicular to an arrangement direction of the first fixture block and the second fixture block.

* * * * *